(12) United States Patent
Ma et al.

(10) Patent No.: US 10,520,672 B2
(45) Date of Patent: *Dec. 31, 2019

(54) OPTICAL HYBRID

(71) Applicant: Elenion Technologies, LLC, New York, NY (US)

(72) Inventors: Yangjin Ma, Brooklyn, NY (US); Yang Liu, Elmhurst, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/159,956

(22) Filed: Oct. 15, 2018

(65) Prior Publication Data

US 2019/0049665 A1 Feb. 14, 2019

Related U.S. Application Data

(63) Continuation of application No. 15/659,220, filed on Jul. 25, 2017, now Pat. No. 10,126,498.

(51) Int. Cl.
*G02B 6/12* (2006.01)
*G02F 1/01* (2006.01)
*H01L 33/58* (2010.01)
*H04B 10/61* (2013.01)

(52) U.S. Cl.
CPC ..... *G02B 6/12004* (2013.01); *G02B 6/12014* (2013.01); *G02B 6/12016* (2013.01); *G02B 6/12019* (2013.01); *G02F 1/011* (2013.01); *H01L 33/58* (2013.01); *H04B 10/61* (2013.01); *G02B 2006/1215* (2013.01); *G02B 2006/12035* (2013.01)

(58) Field of Classification Search
CPC .................. G02B 6/12004; G02B 6/12014
See application file for complete search history.

(56) References Cited

U.S. PATENT DOCUMENTS

| | | | | | |
|---|---|---|---|---|---|
| 4,887,314 | A | * | 12/1989 | Carroll | H04B 10/61 398/204 |
| 8,837,879 | B2 | * | 9/2014 | Jeong | G02B 6/125 385/32 |
| 8,861,902 | B2 | * | 10/2014 | Bontempi | G02B 6/12004 385/129 |
| 8,885,989 | B2 | * | 11/2014 | Jeong | G02B 6/12004 385/1 |
| 9,128,347 | B2 | * | 9/2015 | Kato | G02F 1/225 |
| 9,366,820 | B2 | * | 6/2016 | Konishi | G02B 6/28 |
| 10,126,498 | B1 | * | 11/2018 | Ma | G02B 6/12004 |

(Continued)

*Primary Examiner* — Sung H Pak
(74) *Attorney, Agent, or Firm* — Stratford Managers Corporation

(57) ABSTRACT

An optical circuit capable of operating as a 90° optical hybrid includes a phase-symmetric optical splitter and a 90° optical splitter, and two 2×2 optical couplers as optical combiners. The input ports of the optical combiners and the output ports of the optical splitters face a common area therebetween, with the optical splitters interposed between optical combiners as viewed along the circumference of the common area. The output ports of each optical splitter is connected to closest input ports of the optical combiners with optical waveguides of a same length. The length of the waveguides may be minimized when the optical couplers and the optical splitters are disposed in a cross-like configuration.

20 Claims, 8 Drawing Sheets

(56) References Cited

U.S. PATENT DOCUMENTS

| | | | | |
|---|---|---|---|---|
| 2011/0229069 A1* | 9/2011 | Bontempi | .......... | G02B 6/12004 385/3 |
| 2013/0128907 A1* | 5/2013 | Hsieh | .................. | H01S 3/10053 372/29.023 |
| 2013/0236172 A1* | 9/2013 | Suzuki | ................. | H04B 10/612 398/43 |
| 2016/0274438 A1* | 9/2016 | Shimizu | ................... | G02B 6/12 |

* cited by examiner

OPTICAL HYBRID

CROSS-REFERENCE TO RELATED APPLICATIONS

This application is a continuation of U.S. patent application Ser. No. 15/659,220, filed Jul. 25, 2017, now allowed, which is hereby incorporated by reference herein in its entirety.

TECHNICAL FIELD

The present invention generally relates to photonic integrated circuits, and more particularly relates to an optical hybrid formed of an optical coupler network.

BACKGROUND

Coherent optical communications may require optical mixers capable of mixing signal light with local oscillator (LO) light at one or more specific phase shifts. Quadrature phase shift keyed (QPSK) modulation, which provides a high spectral efficiency and good receiver sensitivity in multilevel coherent transmission systems, typically require a 90° optical hybrid (OH) as such optical mixer at the receiver. A 90 degree optical hybrid is a 6-port device with two input and four output ports, which is represented in FIG. 1A at 10. Ports 11 and 12 are input ports for receiving the signal light "S" and the LO light "LO", respectively, and ports $13_1$ to $13_4$ are the four output ports. The optical hybrid 10 is configured so that when the input signal light "S" and the LO light 'LO" are received at the input ports 11 and 12, each of the four output ports 13 output a mixture of the signal light and the LO light with the optical phase difference $\Delta\Phi_{S\text{-}LO}$ therebetween incremented by 90° from output port to output port (note that the order in which these phase shifts appear in the output ports of an actual device may vary depending on the hybrid's design). Using two pairs of balanced photodetectors (PD) enables then to demodulate the two quadrature components of the optical QPSK modulation in the received signal light "S".

Performance of an optical hybrid in communication system may depend on phase errors within the device, its insertion loss, power balance between the four output ports, and wavelength bandwidth. The last parameter measures the range of wavelength in which the phase error, insertion loss, and power balance remains within allowed tolerances. The phase error is understood as the deviation of the inter-port phase shift increment $\Delta\Phi_{S\text{-}LO}$ from 90°. For long-haul transmissions, the phase error, insertion loss, and power balance metrics should be within design tolerances across the entire C-band.

An optical hybrid may be implemented in a chip as a photonic integrated circuit (PIC) device, for example in the form of a 2×4 or 4×4 multi-mode interference (MMI) coupler, or as a network of 2×2 couplers and 1×2 couplers. In the latter case thermal phase tuning between the couplers is typically used to provide the required 90° phase shifts between ports. A 4×4 MMI coupler is a passive device where the 90° phase shifts are ideally provided by the device geometry without thermal tuning. However, compared to 2×2 couplers, it's more difficult to reach the required phase error and branch power balance tolerances in a 4×4 MMI coupler. For example, a typical phase error in a typical 4×4 MMI coupler may be as high as +/−5 degree. The insertion loss is another concern in designing a 4×4 MMI coupler.

On the other hand, a 2×2 coupler is relatively easier to design to desired tolerances, and typically has a smaller build-in phase error and lower insertion loss than a 4×4 coupler; therefor an optical hybrid built of 2×2 and 1×2 couplers may sometimes be preferable. One drawback of such configurations is that they typically require waveguide crossings to construct the optical hybrid. This would increase the length of total routing waveguide by a substantial amount, introducing phase uncertainties that may eventually degrade the system performance. As a result, thermal phase tuners may be required between the 2×2 and/or 1×2 couplers to control the phase shifts between outputs of different couplers. This thermal tuning complicates the device as it introduced the need to an extra control algorithm, extra optical loss and extra power consumption. It also increases the device footprint as well as complexity of system layout. Additionally, the waveguide crossing may introduce crosstalk to receiver channels.

SUMMARY

Accordingly, the present disclosure relates to optical coupler circuits that may operate as 90° optical hybrids without requiring tunable phase shifters. Aspects of the present disclosure also relate to 90° optical hybrids formed of four optical couplers interconnected without waveguide crossings.

According to an aspect of the present disclosure, an optical circuit is provided comprising a substrate, two optical splitters each having an output end comprising two output ports, and two optical combiners each having an input end comprising two input ports. The two optical splitters and the two optical combiners are disposed upon the substrate with the output ends of the optical splitters and the input ends of the optical combiners positioned facing a common area therebetween, and wherein each of the two optical splitters is interposed between the two optical combiners as viewed along a circumference of the common area. The optical circuit further includes four optical waveguides disposed upon the substrate to separately connect the output ports of the two optical splitters to the input ports of the two optical combiners so that each of the two optical splitters is optically connected to each of the two optical combiners in a non-intersecting manner.

In accordance with an aspect of the present disclosure, the four optical waveguides may comprise: first and second optical waveguides of equal length, each connecting one of the two output ports of one of the two optical splitters to a closest input port of the two optical combiners, and third and fourth optical waveguides of equal length, each connecting one of the two output ports of the other of the two optical splitters to a closest input port of the two optical combiners.

An aspect of the present disclosure provides an optical circuit comprising two optical splitters each having an output end comprising two output ports, and two optical combiners each having an input end comprising two input ports. The two optical splitters are aligned along a first axis with their output ends facing each other. The two optical combiners are aligned along a second axis perpendicular to the first axis, with their input ends disposed facing each other across the first axis at a same distance therefrom. The optical circuit further includes four optical waveguides, each connecting one of the two input ports of one of the two optical combiner to a closest output port of one of the two optical splitters. For each of the two optical splitters, optical waveguides connecting output ports thereof to input ports of the two optical combiners may be of the same optical length.

An aspect of the present disclosure relates to an optical circuit comprising: a substrate; four optical couplers each having a first end comprising two optical ports, wherein the four optical couplers are disposed upon the substrate with the first ends thereof facing a common area therebetween; and four optical waveguides disposed upon the substrate to connect each of the optical ports at the first ends of the couplers to a closest optical port of a next optical coupler as seen along a circumference of the common area. The four optical couplers may comprise a phase-symmetric optical splitter, a 90° optical splitter and two 90° optical combiners each in the form of a 2×2 optical coupler, wherein the two optical combiners are interposed between the optical splitters as viewed along a circumference of the common area.

BRIEF DESCRIPTION OF THE DRAWINGS

Embodiments disclosed herein will be described in greater detail with reference to the accompanying drawings which represent preferred embodiments thereof, in which like elements are indicated with like reference numerals, and wherein.

DETAILED DESCRIPTION

Figure 1A:
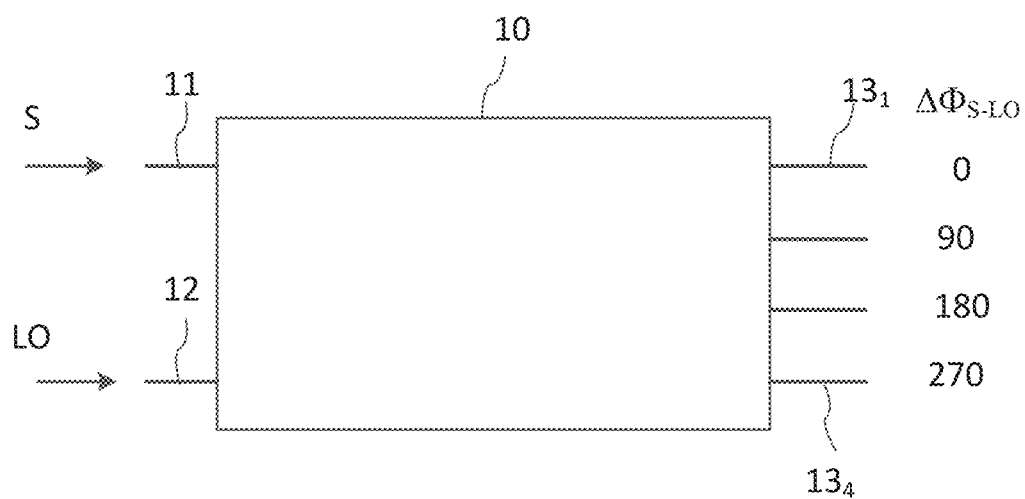
FIG. 1A is a schematic diagram of a 90° optical hybrid.

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Furthermore, the following abbreviations and acronyms may be used in the present document:
GaAs Gallium Arsenide
InP Indium Phosphide
PIC Photonic Integrated Circuit
SOI Silicon on Insulator
SiP Silicon Photonics
PSK Phase Shift Keying
BPSK Binary Phase Shift Keying
QAM Quadrature Amplitude Modulation
QPSK Quaternary Phase Shift Keying Note that as used herein, the terms "first", "second" and so forth are not intended to imply sequential ordering, but rather are intended to distinguish one element from another, unless explicitly stated. Similarly, sequential ordering of method steps does not imply a sequential order of their execution, unless explicitly stated. The term "90° coupler" is used herein to refer to an optical coupler that is configured to split input light into two output light signals having substantially a 90° ($\pi/2$ radian) optical phase shift therebetween. It will be appreciated that the phase shift between output ports of real-life 90° couplers may deviate from 90° by a few degrees due to fabrication tolerances and environmental variations, resulting in phase errors. The term "2×2 optical coupler" as used herein refers to a 90° optical coupler with two input ports and 2 output ports. The term "input optical port" my refer to a portion or an element of an optical coupler that may receive input light, which is then directed by the optical coupler to at least one of the output ports. The term 'optical splitter" is used to refer to an optical coupler that is used to split input light into two light signals. The term 'optical combiner" refers to an optical coupler that is used to combine two input light signals into one or more output light signals each of which formed of a mixture of the two input light signals. The term "phase-symmetric optical splitter" refers to an optical coupler that is configured to split input light into two light signals of substantially same optical phase.

The present disclosure relates to photonic integrated circuits (PICs) formed of interconnected optical couplers, and more particularly relates to optical hybrids formed by such coupler circuits.

Figure 1B:
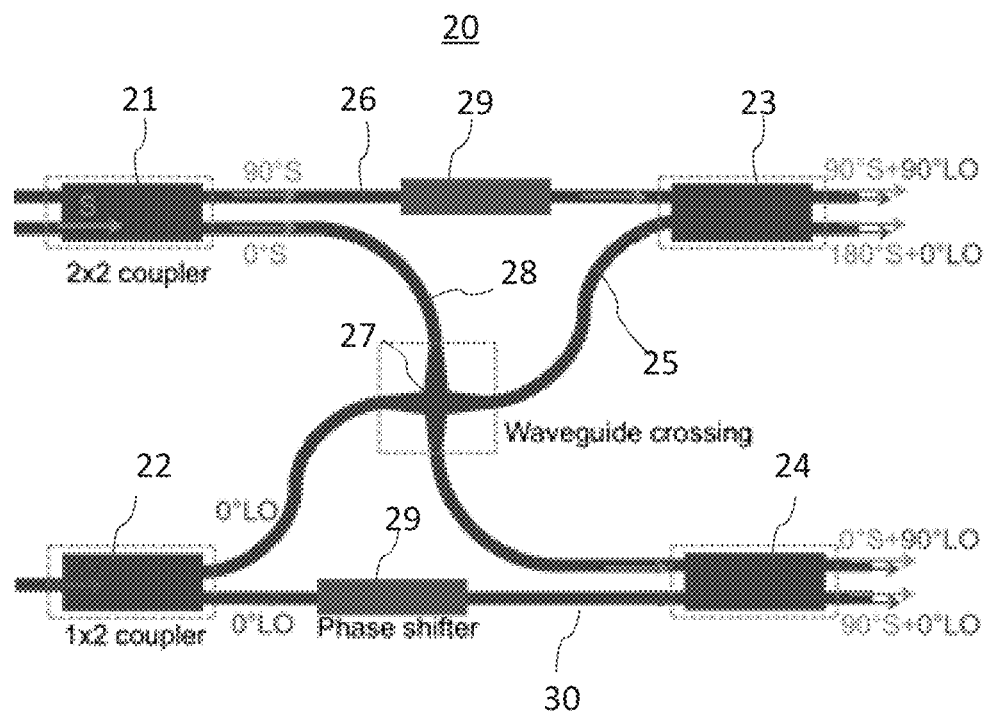
FIG. 1B is a schematic diagram of a 90° optical hybrid formed by a coupler circuit wherein output ports of two input optical couplers are cross-coupled with input ports of two output optical couplers using phase tuners.

With reference to FIG. 1B, there is illustrated an optical circuit 20 formed of two optical splitters 21 and 22 at its input, which is to the left in the figure, and two optical combiners 23, 24 at its output (to the right in the figure), with the output ports of the optical splitters cross-coupled to the input ports of the optical combiners. When one of the optical splitters 21, 22 and both of the optical combiners 23, 24 are if the form of 90° optical couplers, and the other of the two optical splitters 21, 22 is phase-symmetric, optical circuit 20 may form a 90° optical hybrid, provided that optical phase delays in waveguide interconnects 26, 28 between the output ports of the splitter 21 and the input ports of the combiners 23, 24 are equal to each other, modulo 360° or $2\pi$ radian, and the optical phase delays in waveguide interconnects 25, 30 between the output ports of the splitter 22 and the corresponding input ports of the combiners 23, 24 are also equal to each other, modulo $2\pi$ radian. When these conditions are met, signal light "S" and LO light "LO" received at the input ports of the optical splitters 21, 22, for example as illustrated in FIG. 1B, will be mixed together by the combiners 23 and 24 in such a way that the four output ports of the combiners 23 and 24 will output four light signals in which the signal and LO light are mixed with the optical phase difference $\Delta\Phi_{S\text{-}LO}$ therebetween incremented by 90°, 180°, or 270° from port to port.

Since the waveguides 26 and 28 are of different lengths, and the waveguides 25 and 30 are also of different lengths, phase shifters 29 are required for phase tuning to equalize the optical phase delays in the interconnects. Another drawback of circuit 20 is the presence of a waveguide crossing 27 that may lead to signal crosstalk and additional optical loss.

Figure 2:
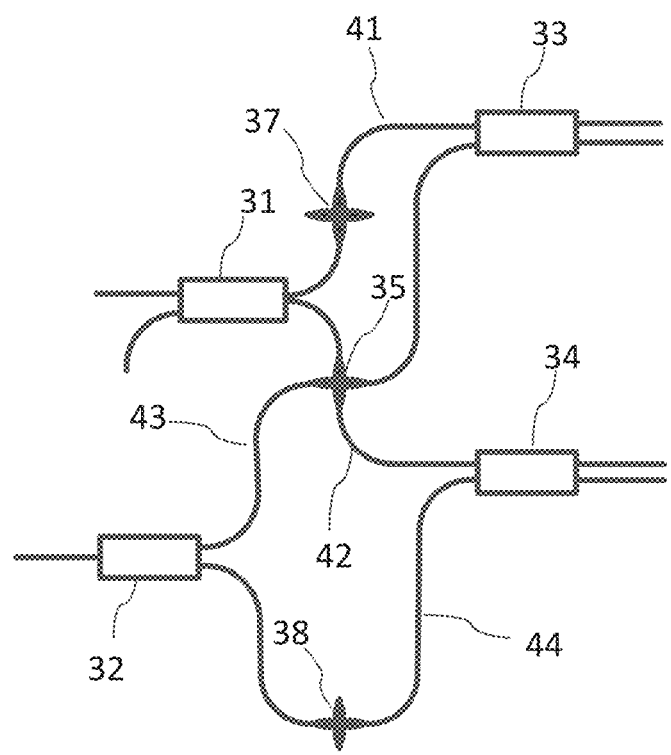
FIG. 2 is a schematic diagram of a 90° optical hybrid formed by a coupler circuit wherein output ports of two input optical couplers are cross-coupled with input ports of two output optical couplers using equal-length waveguide interconnects and no phase tuners.

With reference to FIG. 2, there is illustrated an optical circuit 30 that may be viewed as an embodiment of circuit 20 without phase shifters. In this circuit, output ports of an input 2×2 splitter 31 and an input 1×2 splitter 32 are cross-coupled to input ports of two output 2×2 optical combiners 33 and 34 using optical waveguides 41, 42, 43 and 44 that are routed so as to pair-wise equalize their lengths. The optical waveguides 41 and 42 that connect the two output ports of the first splitter 31 are configured to be of the same length, and therefore provide light from the first splitter to the two combiners 33, 34 with the same phase delay, thereby potentially eliminating the need for a tunable phase shifter. Similarly, the optical waveguides 43 and 44 that connect the two output ports of the second splitter 32 are routed so as to be also of the same length, and therefore provide light from the second splitter to the two combiners 33, 34 with the same phase delay, which may however be different from the phase delay in waveguides 41 and 42. Furthermore, 'dummy' waveguide crossings 37 and 38 may be added to waveguides 41 and 44 so as to balance out phase distortions and loss that may be associated with the waveguide crossing 35 between waveguides 42 and 43.

The circuit layout of FIG. 2 retains the waveguide crossing 35, which may lead to signal crosstalk in the circuit. Furthermore, the pair-wise equalization of the length of the waveguide interconnects 41, 42 and 43, 44 between the output ports of each of the input splitters 31, 32 and the input ports of the output combiners 33, 34 is accomplished by lengthening of at least some of these waveguides as compared to the layout of FIG. 1A. Although theoretically the accumulated phase delays in the routing waveguides of the same lengths should be balanced out, in practice optical waveguides may suffer from non-idealities such as sidewall roughness, non-uniform exposure during lithography, or other fabrication non-uniformities, and the like. As a result, phase error may accumulate differently in two different routing waveguides nominally of the same length as light propagates therein. Therefore, the phase error of this design may strongly depend on the footprint and fabrication.

Figure 3:
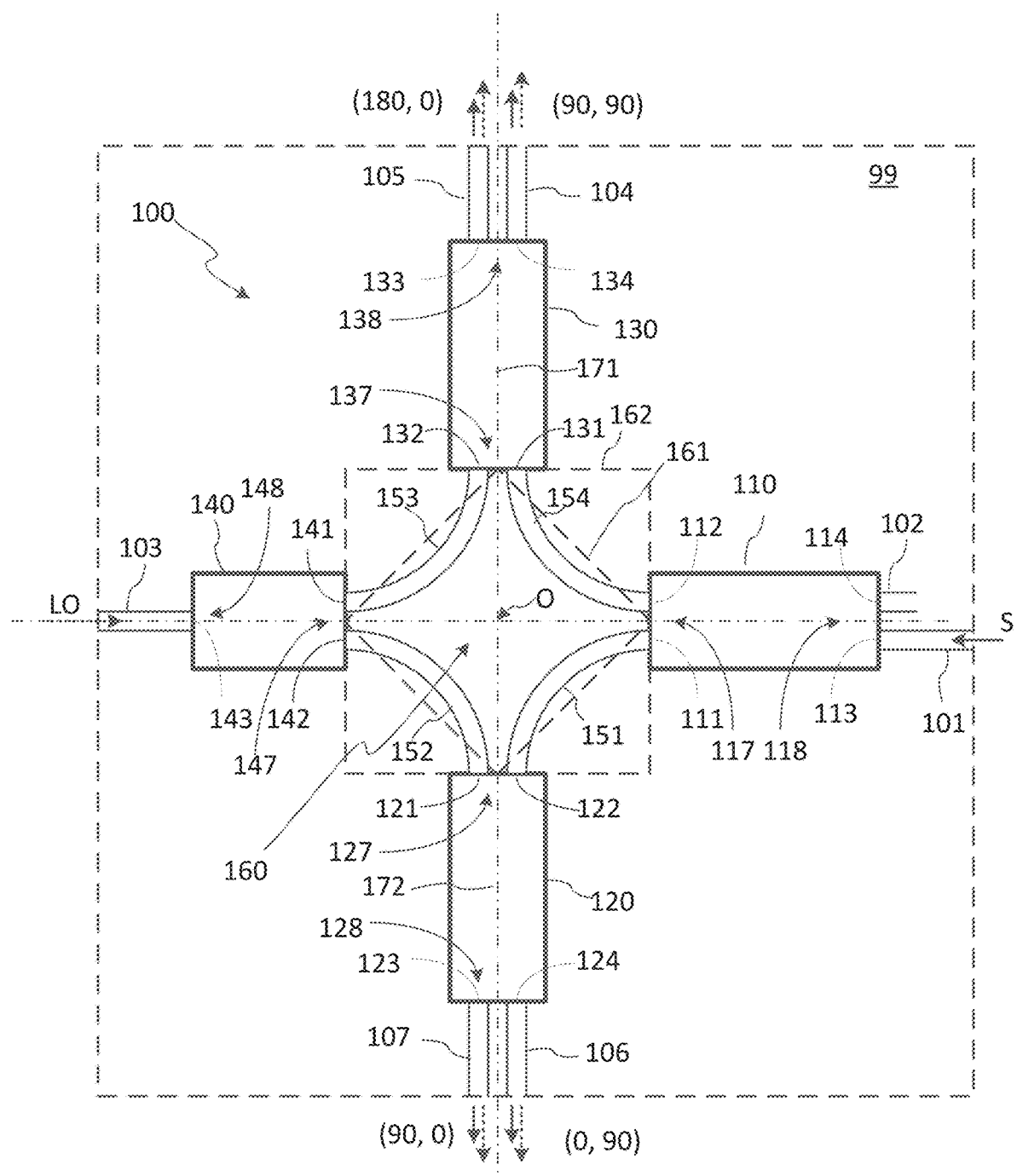
FIG. 3 is a schematic diagram of an optical circuit formed of four optical couplers with non-intersecting waveguide interconnects of equal length.

Turning now to FIG. 3, there is illustrated an optical circuit 100 which is free of waveguide crossings, has relatively short waveguide interconnects, and may operate as a 90° optical hybrid without requiring tunable phase shifters. The optical circuit 100, which may also be referred to as the optical coupler circuit 100 or simply as circuit 100, is formed of four optical couplers 110, 120, 130, and 140 that are disposed upon a substrate 99 so that their first ends 117, 127, 137, and 147 respectively face a common area 160 therebetween, which may also be referred to herein as the coupler interconnect area. Each of the first ends of the four couplers have two optical ports that are interconnected with four optical waveguides 151-154 so that each of the optical waveguides connects one of the optical ports at the first ends of the couplers to a closest optical port of a next optical coupler as seen along a circumference 162 of the common area 160 in either clockwise or counterclockwise directions. Each of the couplers 110, 120, 130, 140 may also have a second end 118, 128, 138, and 148 respectively, which may have one or two optical ports. The first ends 117, 127, 137, 147 of the couplers may also be referred to herein as the inner coupler ends, and their second ends 118, 128, 138, 148—as the outer coupler ends.

As illustrated, the four optical waveguides 151-154 connect the first ends of the four optical couplers 110, 120, 130, 140 in a ring-like structure, wherein first waveguide 151 connects a first port 111 of coupler 110 to a second port 122 of coupler 120 that is disposed next to coupler 110 in the clockwise direction, second waveguide 152 connects a first port 121 of coupler 120 to a second port 142 of coupler 140 that is disposed next to coupler 120 in the clockwise direction, third waveguide 153 connects a first port 141 of coupler 140 to a second port 132 of coupler 130 that is disposed next to coupler 140 in the clockwise direction, and finally fourth waveguide 154 connects a first port 131 of coupler 130 to a second port 112 of coupler 110, closing the ring. Here, the two ports at the first ends of each of the couplers are referred to as the first and second ports in accordance with their order when viewed in the counter-clockwise direction along the circumference 162 of the coupler interconnect area 160.

Embodiments described hereinbelow relate to the use of circuit 100 as an optical mixer, wherein light received by two opposing optical couplers, such as for example couplers 110 and 140, is mixed by the circuit and exits from ports at the outer ends of the two remaining couplers, for example 120 and 130. Accordingly, optical couplers 110 and 140 may be referred to as the first and second optical splitters, respectively, with their inner ports 111, 112, 141, 142 referred to as output ports of the respective splitters, and their outer optical ports 113, 114, and 103 referred to as the input ports of the two splitters. The optical couplers 120 and 130 may be referred to as the first and second optical combiners, respectively, with their inner ports 121, 122, 131, 132 referred to as input ports of the respective combiners, and their outer optical ports 123, 124, and 133, 134 referred to as the output ports of the respective combiners. The first ends 117, 147 of couplers 110 and 140 may be referred to as the output ends, while their second ends 118, 148—as the input ends. The first ends 127, 137 of couplers 120 and 130 may be referred to as the input ends of the respective combiners while their second ends 128, 138—as their output ends.

In one embodiment optical combiners 120, 130, and optical splitter 110 may each be in the form of a 90° optical coupler, and the second optical splitter 140 may be a phase-symmetric optical coupler or splitter. It may also be preferred that each of the four couplers has a one-to-one power splitting ratio. When furthermore optical waveguides 153 and 152 are of substantially the same optical length $l_1$, and optical waveguides 154 and 151 are also of substantially the same optical length $l_2$, circuit 100 may operate as a 90° optical hybrid. Note that, contrary to the optical hybrid layouts of FIGS. 1A, 1B, and 2, in this implementation the optical combiners 120 and 130 are interposed between the optical splitters 110 and 140 as seen along the circumference 162 of the interconnect area 160, which enables interconnecting the outputs of splitters 110, 140 with the inputs of combiners 120, 130 without waveguide crossings.

Figure 6:
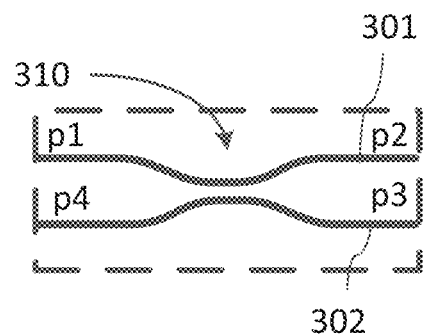
FIG. 6 is a schematic diagram of a directional coupler.
Figure 7:
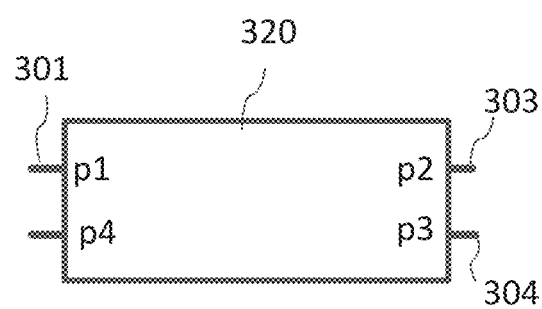
FIG. 7 is a schematic diagram of a 2×2 MMI coupler.

Splitter 110 and combiners 120 and 130 may each be implemented in the form of a 2×2 optical coupler, for example such as those illustrated in FIGS. 6 and 7. A 2×2 optical coupler interconnects two input ports with two output ports thereof with a target power splitting ratio and a target phase shift between output ports. Typically 2×2 optical couplers are designed so that light received in any one of the input ports exits from the two output ports with a 90° phase shift therebetween. Assuming a one-to-one splitting ratio, the transfer matrix T of a 90° 2×2 coupler is given by equation (1):

$$T = \frac{\sqrt{2}}{2}\begin{bmatrix} 1 & j \\ j & 1 \end{bmatrix} \quad (1)$$

where $j=\sqrt{(-1)}$ denotes the imaginary unit.

Denoting input ports of a 2×2 coupler as p1 and p4 and output ports as p2 and p3 as illustrated in FIGS. 6 and 7, with the p1→p2 and p4→p3 connections within the coupler defined as 'through' and the p1→p3 and p4→p2 connections within the coupler defined as 'cross', light received at port p1 will be output in equal portions from ports p2 and p3 with a 90° phase shift therebetween, as follows from equation (2):

$$\begin{bmatrix} E_{p2} \\ E_{p3} \end{bmatrix} = \frac{\sqrt{2}}{2}\begin{bmatrix} 1 & j \\ j & 1 \end{bmatrix} \cdot \begin{bmatrix} E_{p1} \\ 0 \end{bmatrix} = \frac{\sqrt{2}}{2}\begin{bmatrix} E_{p1} \\ jE_{p1} \end{bmatrix} \quad (2)$$

Here $E_{p1}$ indicates the optical field of light received at port p1, while $E_{p2}$ and $E_{p3}$ indicate the optical fields of light output from ports p2 and p3, respectively.

Referring again to FIG. 3, as illustrated optical combiner 120 has input ports 121, 122 and output ports 123, 124; optical combiner 130 has input ports 131, 132 and output ports 133, 134; optical splitter 110 has output ports 131, 132 and an input port 113, and may have a second input port 114 that may remain unused. Splitter 140 may be for example in the form of a Y-branch optical coupler having input port 143 at its second, or input, end 148.

In operation an optical signal S may be provided for example into input port 113 of the first optical splitter 110 via first input waveguide 101, while a reference optical signal, such as LO light, into input port 143 of the second optical splitter 140 via second input waveguide 103, as indicated in the figure by a solid arrow labeled 'S" at port 113 and a dashed arrow labeled "LO" at port 143, respectively. In other embodiments the optical signal S and the LO signal may be switched between the input ports 113 and 143. The phase-symmetric splitter 140 outputs the LO light from the output ports 141, 142 with substantially the same phase, possibly subject to small phase errors in the coupler. Waveguides 152, 153 are preferably of the same optical length, and guide the LO light portions from the output ports 141, 142 into input ports of each of the optical combiners 120 and 130, i.e. in the first input port 121 of combiner 120 and the second input port 132 of combiner 130, which are the input ports of the two combiners 120, 130 that are closest to the respective output ports 141, 142 of the second splitter 140. Each of the combiners 120, and 130 then split the LO light into two preferably equal portions, and couple them into the two output ports of the corresponding combiner adding a 90° phase shift therebetween. The first splitter 110 sends a first portion of the signal light S into the second input port 122 of combiner 120 over waveguide 151 and sends a second, preferably equal, portion of the signal light S over waveguide 154 into the first input port 131 of combiner 130, adding a 90° phase shift therebetween. Waveguides 151, 154 are preferably of the same optical length. The input ports 131, 122 of the two combiners 120, 130 are the closest input ports to the respective output ports 111, 112 of the first splitter 110, so that no waveguide crossings occurs. Each of the combiners 120 and 130 then further splits the received portions of the signal light S into two preferably equal portions, and couple them into the two output ports of the corresponding combiner with a further 90° phase shift therebetween. Thus, the two output ports 123, 124 of the first combiner 120 and the two output ports 133, 134 of the second combiner 130 output mixed light wherein the LO light is added to the signal light S with the phase shift $\Delta\Phi_{S-LO}$ therebetween incremented by 90° from port to port. More particularly, denoting the signal-LO phase shift $\Delta\Phi_{S-LO}$ at port 134 as $\Delta\Phi_{ref}$, in the illustrated embodiment $\Delta\Phi_{S-LO}$ at port 133 is equal to $(\Delta\Phi_{ref}+180°)$, $\Delta\Phi_{S-LO}$ at port 123 is equal to $(\Delta\Phi_{ref}+90°)$, and $\Delta\Phi_{S-LO}$ at port 124 is equal to $(\Delta\Phi_{ref}-90°)=(\Delta\Phi_{ref}+270°)|_{MOD\ 360}$. Here the notation $(A)|_{MOD\ 360}$ means $(A°\ modulo\ 360°)$. Note that in FIG. 3 the LO light is shown with dashed arrows, signal light 'S' is shown with solid arrows, and the pairs of numbers near each of the output ports of the combiners are in the form $(\Phi_S, \Phi_{LO})$, where $\Phi_S$ and $\Phi_{LO}$ are the phase shifts of the signal light and the LO light, respectively, accrued due to the port cross-coupling in the 90° couplers. Waveguides 104-107 may be used to guide the mixed S, LO light with incremented 90° phase shifts from the respective output ports 134, 133, 124, 123 to other optical elements for processing. In the illustrated embodiment, they guide the two pairs of mixed light signals to two opposite edges of the chip.

The optical coupler circuit 100 of FIG. 3 represents an example embodiment wherein the optical combiners 120, 130 and the optical splitters 110, 140 are aligned along two orthogonal axes 171, 172 in a cross-like arrangement, each in a different leg of the cross, with the output end 117 of the first splitter 110 directly facing the output end 147 of the second splitter 140 across from a center 'O' of the cross, and the input end 127 of the first combiner 120 directly facing the input end 137 of the second combiner 130 across from the center 'O' of the cross. Furthermore, each of the output ends of the splitters 110, 140 and the input ends of the combiners 120, 130 may be located at centers of the four sides of square 162, which may be viewed as defining the circumference of the coupler interconnect area 160. With this layout, the output ends 117, 147 of the two optical splitters 110, 140 and the input ends 127, 137 of the two optical combiners 120, 130 are disposed at four corners of a smaller inner square 161, with the output ends 117, 147 of the optical splitters 110, 140 facing each other across a diagonal of the square 161, and the input ends 127, 137 of the optical combiners 120, 130 facing each other across the other diagonal of the square 161. The output ports 111, 112 and 141, 142 of the first and second splitters 110, 140 are then positioned at opposite corners of the inner square 161 equidistantly from their respective closest combiner input ports 122, 131 and 132, 121. In this embodiment all waveguide interconnects 151-154 may be made of equal length and may each be for example in the form of a 90° waveguide bend. For given distances between waveguide ports in each of the couplers, the radius R of this waveguide bend defines the distance between the ends of the opposing couplers, and therefore the size of the interconnect area 160, which may be therefore limited mainly by requirements on the radiative loss in the waveguide bends. By way of example, in embodiments wherein the optical circuit 100 is implemented in a SOI chip, the optical waveguides 151-154 may be high-contrast waveguides with silicon cores and dielectric claddings, for example of silicon dioxide or silicon nitride, and the bend radius R of the waveguides 151-154 may be in the range of 2 to 10 microns (μm), for example 7 μm, resulting in the waveguide interconnects as short as about 3-16 μm, for example about 11 μm. By way of example, the interconnect area 162 may be about 14×14 μm$^2$, which is about two orders of magnitude more compact than the interconnect are of the coupler circuit of FIG. 2. Waveguide in such a small area may be made with relatively small non-uniformity from lithography and etching, thereby enabling suitably small phase errors without tunable phase shifters.

Thus, the layout of circuit 100 wherein the four optical couplers are connected by waveguides in a ring-like structure, with two of the optical couplers that function as splitters interposed between the other two of the optical couplers that function as combiners when viewed along the ring, enables to provide a 90° optical hybrid that is built from a relatively simple 2×2 and 1×2 couplers interconnected by short waveguides of equal lengths without waveguide crossings and without the need for tunable phase shifters.

Figure 4:
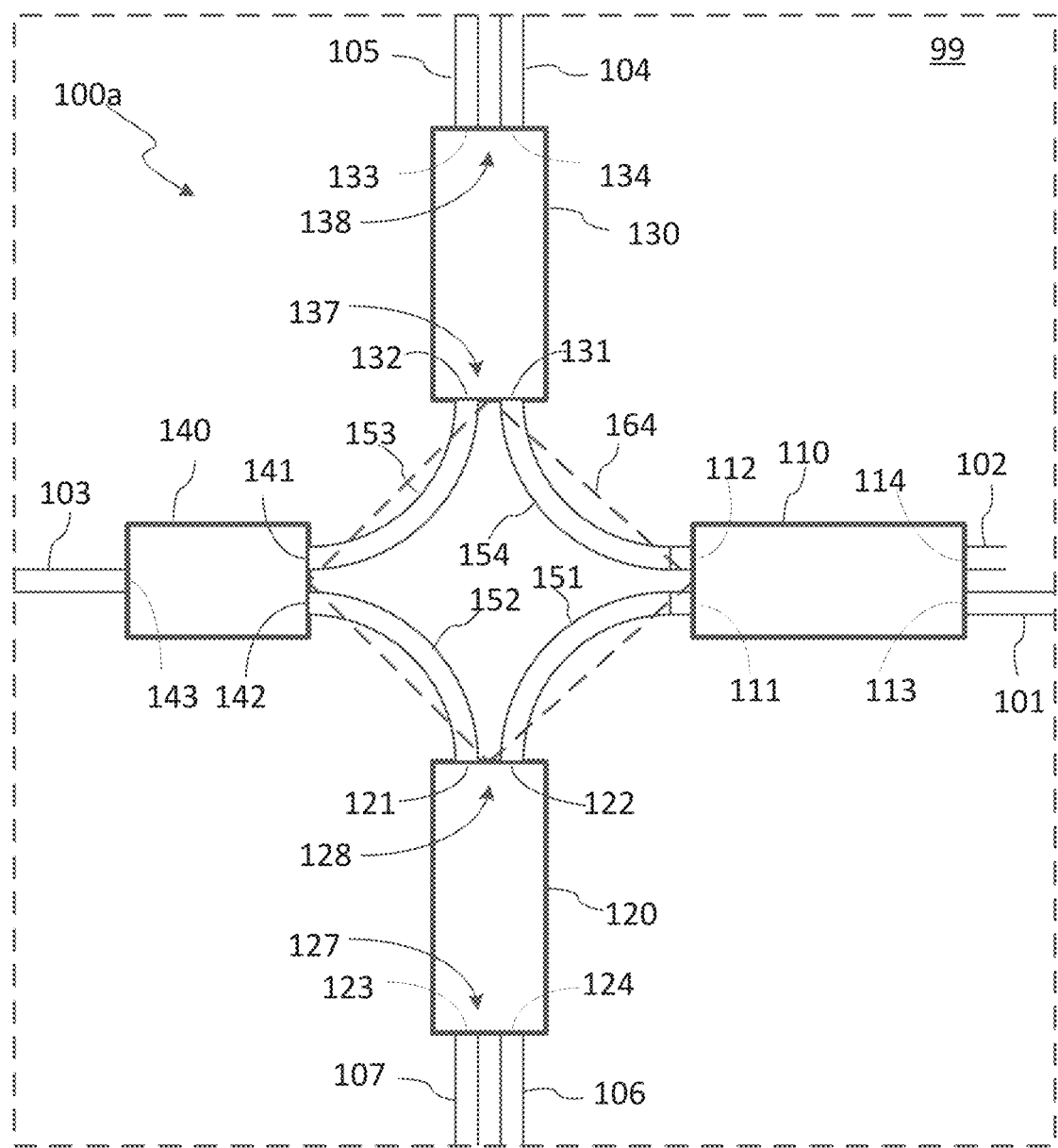
FIG. 4 is a schematic diagram of an embodiment of the optical hybrid of FIG. 3 with opposing ends of the optical couplers disposed at corners of a kite-shaped area.

Although the layout of FIG. 3 may be optimized in size which may be preferable in some applications, it will be appreciated that variations of this layout that maintain at least some of its advantages are possible. For example FIG. 4 illustrates a modification 100a of circuit 100 in which waveguides 151, 154 connecting the output ports of the first splitter 110 to their respective closest input ports 122, 131 of the combiners 120, 130 are of the same length $l_2$, and waveguides 152, 153 connecting the output ports of the second splitter 140 to their respective closest input ports 121, 132 of the combiners 120, 130 are also of the same length $l_1$, they are not equal in length to each other, i.e. $l_1 \neq l_2$. In this embodiment, the output ports 111, 112 and 141, 142 of the first and second splitters 110, 140 may be positioned for example at four corners of an area which circumference 164 is shaped as a kite, so that the output ports 111, 112 of the first splitter 110 are positioned equidistantly from their respective closest input ports 122, 131 of the first and second combiners 120 and 130, while the output ports 141, 142 are positioned equidistantly from their respective closest input ports 132, 121 of the first and second combiners 120 and 130. FIG. 4 illustrates an embodiment wherein $l_2 > l_1$, while in other embodiments $l_2$ may be smaller than $l_1$.

Figure 5:
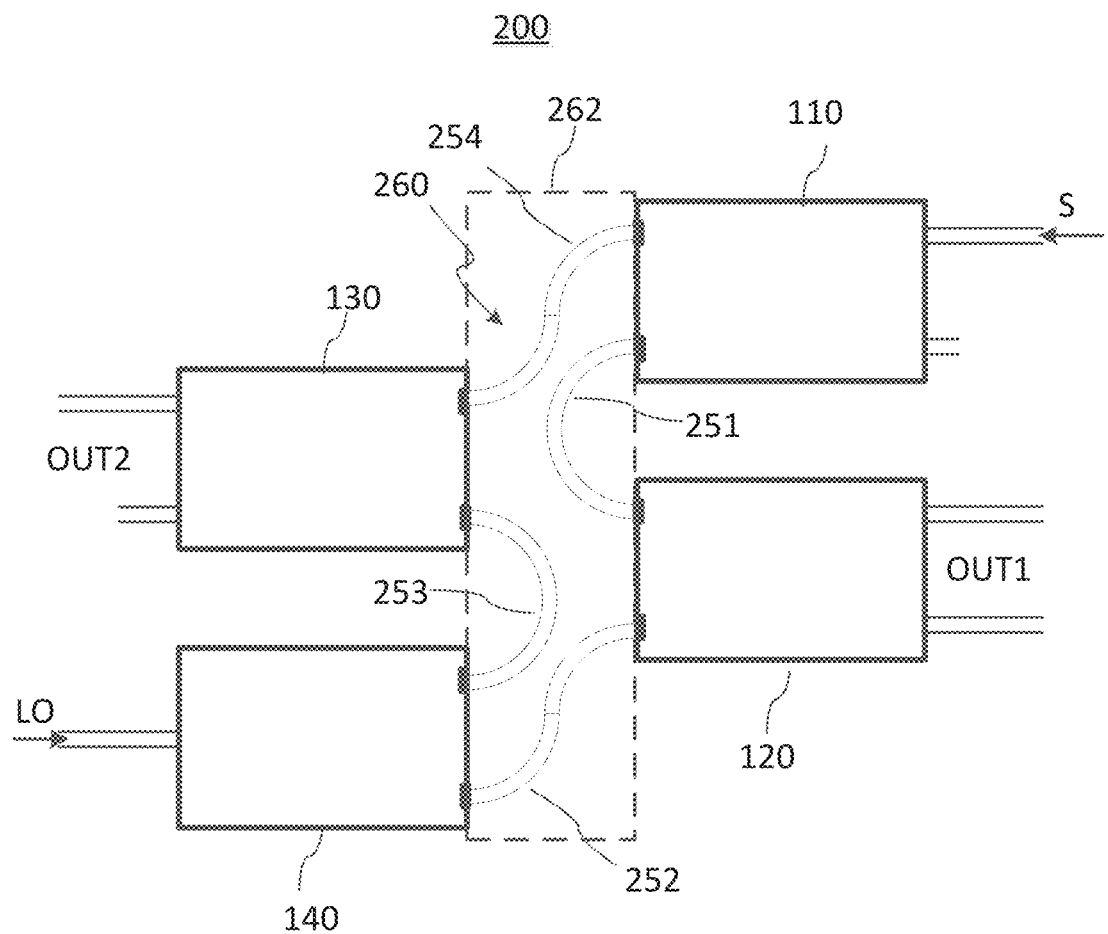
FIG. 5 is a schematic diagram of an embodiment of the optical hybrid of FIG. 3 with each of the optical splitters disposed side by side with one of the optical combiners.

Turning now to FIG. 5, there is illustrated an optical circuit 200 wherein the four optical couplers 110, 120, 130, and 140 are interconnected using four waveguides 251-254 in a manner that is topographically same or similar to those illustrated in FIGS. 3 and 4, i.e. forming a ring-like structure, with input ends of combiners 120, 130 and output ends of splitters 110, 140 facing a common area 260, which in this embodiment may be viewed as being of a rectangular shape with a circumference 262. Here the term 'ring' is understood generally as a closed non-intersecting contour defined in part by the four waveguides 251-254 or 151-154 and optical coupling within the splitters and combiners. Note that circumference 262 may generally be any closed non-intersecting contour that bounds an interconnect area including the waveguides 251-254. Similar to circuits 100 and 100a of FIGS. 3 and 4, in the circuit of FIG. 5 the output ports of the first splitter 110 are each connected to a closest input port of one of the combiners 120 and 130 that is disposed next to the splitter 110 in either clock-wise or counter-clock wise direction as viewed along circumference 262, and the waveguides 251, 254 implementing the connections are of the same length. Similarly, the output ports of the second splitter 140 are each connected to a closest input port of one of the combiners 120 and 130 that is disposed next to the corresponding output splitter port in either clock-wise or counter-clock wise direction as viewed along circumference 262, and the waveguides 252, 253 implementing the connections are of the same length. In the illustrated embodiment, all of the waveguides 251-254 are each in the form of two 90° arcs connected at the ends, and are thus all of the same length. In other embodiments waveguides 251, 254 may be of a first length while waveguides 252, 253 may be of a second length different from the first length.

FIGS. 6 and 7 illustrated example 2×2 couplers which may be used as the optical combiners 120, 130 and the first optical splitter 110 in optical circuits of FIGS. 3-5 to implement a 90° optical hybrid.

FIG. 6 schematically illustrates a directional coupler formed of two optical waveguides 301 and 302 having a coupling region 310 where the two optical waveguides are close enough so that a desired fraction of light propagating in one of the optical waveguides can be coupled into the other of the optical waveguides, acquiring an additional phase shift of 90° compared to the portion of light that remains in the same waveguide. Any two cross-sections of the waveguides 301 and 302 that optically follow the coupling area 310 in the direction of light propagation and are at the same optical distance along the respective waveguides from the coupling area 310 may be viewed as the output optical ports of the coupler. When the length of the coupling region 310 is selected so as to couple half of the input light into the adjacent waveguide with the other half remaining in the input waveguide, the transfer function of this coupler may be described by equation (1).

FIG. 7 schematically illustrates a 2×2 MMI coupler that is formed of a section of a multi-mode (MM) slab waveguide 320 that abuts two spaced apart input waveguides 301, 302 at its input side and two spaced apart output waveguides 303, 304 at its output side. In some embodiments, only one input waveguide may be present. The length of the MM slab waveguide 320 and the distance between the output ports where waveguide 303, 304 abut the MMI portion 320 may be selected so that light that is provided into the input waveguide 301 is output partly from output waveguide 303 and partly from output waveguide 304, with a desired phase shift therebetween. The MIMI coupler may be designed so that this phase shift is 90°±3°, or preferably 90°±1°, so that the transfer function of the MMI coupler of FIG. 7 may also be described at least approximately by equation (1).

Figure 8:
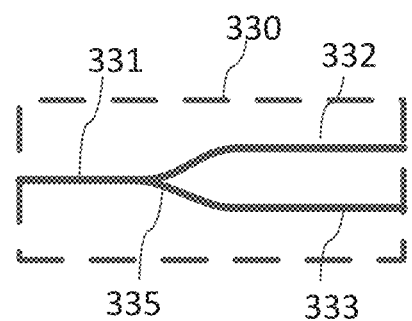
FIG. 8 is a schematic diagram of a Y-branch waveguide coupler.

FIG. 8 illustrates a Y-branch waveguide coupler 330 with an input waveguide 331 that branches at a Y-junction 335 into two output waveguides 332 and 333. When the two output waveguides 332, 333 extending from the Y-junction 335 are of the same optical length, the Y-branch waveguide coupler 330 is phase-symmetric, i.e. it splits light propagating in the input waveguide 331 into two light portions without inducing a phase shift therebetween.

Figure 9:
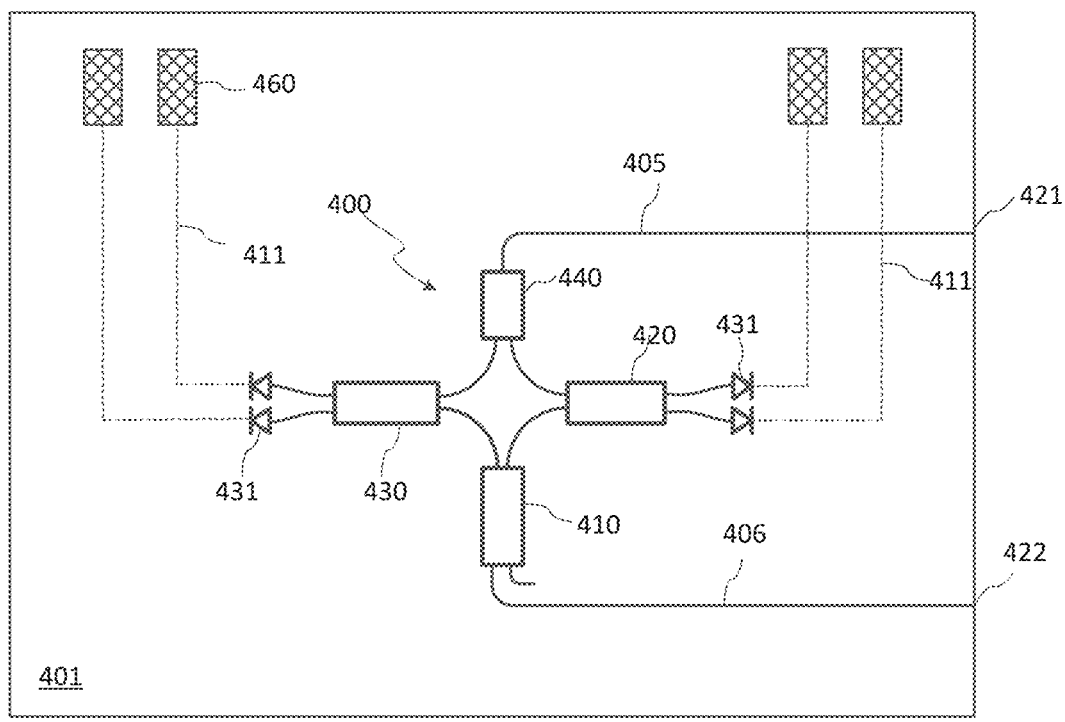
FIG. 9 is a schematic diagram of a single-polarization coherent receiver chip using the optical circuit of FIG. 3 as a 90° optical hybrid.

Turning now to FIG. 9, there is schematically illustrated an example layout of a PIC chip in which a cross-shaped optical coupler circuit 400 of the type shown in FIG. 3 is used in a quadrature demodulator of an optical coherent receiver. The optical coupler circuit 400 functions as a 90° optical hybrid and is formed in or upon a planar substrate or wafer 401. Similar to the optical circuit 100 of FIG. 3, OH 400 is formed of two opposing optical combiners 420, 430 cross-aligned with two opposing optical splitters 440 and 410 in a cross-like layout. The optical combiners 420 and 430 and the first optical splitter 410 are 2×2 optical couplers, such as for example 90° MMI couplers or directional couplers, that are configured to split input light into two light portions of approximately equal optical power and a 90° phase shift therebetween. The second optical splitter 440 is a phase-symmetric optical splitter, such as for example the Y-branch splitter illustrated in FIG. 8. The output ports of each of the optical splitters 410, 440 are connected by optical waveguides to nearby input ports of the two optical combiners 420, 430 to form a ring-like structure without waveguide crossings, in substantially the same way as described hereinabove with reference to splitters 110, 140 and combiners 120, 130 of the optical circuit 100 of FIG. 3. For each of the optical splitters 410 and 440, the optical waveguides connecting their output ports to the nearest input ports of the two combiners 420, 430 are designed to be of the same length. Input waveguides 405 and 406, which connect to the input ports of the splitters 440 and 410 respectively, terminate at an edge of the chip to form input optical ports 421, 422 of the optical circuit of the chip. In operation circuit ports 421 and 422 may separately receive input signal light, which may be for example QPSK or QAM modulated, and LO light. Each of the output ports of the optical combiners 420 and 430 is coupled to a photodiode (PD) 431. Each of the PDs 431 converts light received from the corresponding output port of the combiners 420 or 430 into an electrical signal, which is then provided to one of the contact pads 410 using conducting leads 411 indicated in the figure with dotted lines. Some of the conducting leads 411 may cross one of the input optical waveguides 421 or 422. For example conducting lead 405 may be in the form of, or include, a metal strip disposed over a top cladding of the input optical waveguide 405 and, optionally, over a buffer layer, bridging the waveguide at a sufficient distance from its core so as not to increase optical absorption in the waveguide. The four photodiodes 431 may be configured into two balanced photo receivers using external electrical circuitry as known in the art. The photodiodes 431 may be either formed within a semiconductor layer of the chip or be mounted upon substrate 401 using hybrid integration. In some embodiments the balanced receiver circuitry may also be implemented at least in part in the same chip if the chip includes suitable semiconductor material.

Figure 10:
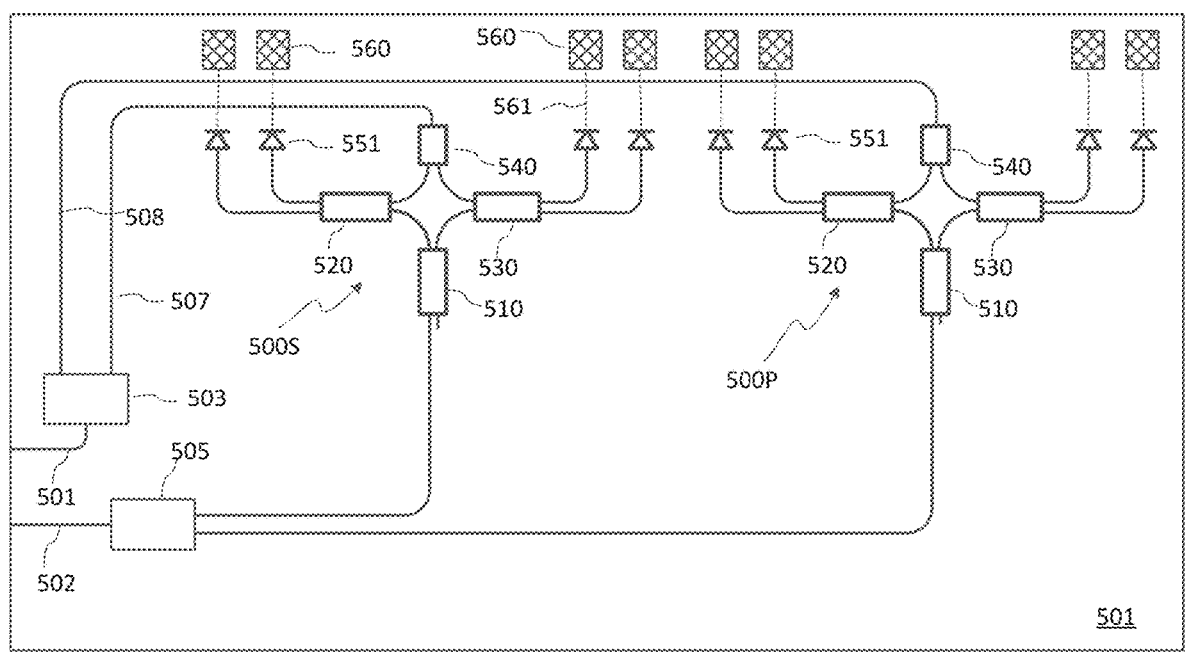
FIG. 10 is a schematic diagram of a dual-polarization coherent receiver chip using two optical circuits of FIG. 3 as 90° optical hybrids.

Turning now to FIG. 10, it shows an example layout of a dual-polarization quadrature demodulator with optical coupler circuits of the type illustrated in FIGS. 3 and 4. In this embodiment the PCI chip includes two instances of the cross-shaped coupler circuit of FIG. 3 that may be formed in or upon a same substrate or wafer 501. These two optical coupler circuits, which may be substantially identical in layout but do not have to be, implement two 90 degree optical hybrids; they are generally indicated in the figure with reference numerals 500S and 500P and may be generally referred to herein as hybrids 500. The illustrated circuit may be used to demodulate optical QPSK or QAM signals received in an input waveguide 502. A polarization beam splitter and rotator (PBSR) 505, which may be formed in the same substrate or wafer 501, splits input light signal into two orthogonal polarizations, rotates one of them, and passes light of the two polarizations into input ports of first optical splitters 510 of the two optical hybrids 500. A beam splitter 503 splits LO light, which may be received into waveguide 501 from a LO source (not shown), into two portions, and sends each of them into an input port of second optical splitters 540 of each hybrid 500 along optical waveguides 507, 508. Output ports of the optical combiners 520, 530 of each hybrid 500 are coupled to PDs 551, which are connected to electrical pads 560 using conducing leads indicated in the figure with dotted lines. In each hybrid 500P and 500S, optical combiners 520, 530 and optical splitter 510 may be in the form of a 90° 2×2 optical coupler, and the second optical splitter 540 may be a phase-symmetric optical splitter. For each of the optical splitters 510 and 540, the optical waveguides connecting their output ports to the input ports of the respective combiners 520, 530 are designed to be of the same length. As illustrated, input waveguides 501 and 502 that connect to the input ports of the splitter 503 and the PBS 505 may terminate at an edge of the chip to form two input optical ports. In other embodiments alternative input arrangements may be provided, such as for example vertical couplers in the form of grating couplers or slanted-wall groves that may be formed in or across the input waveguides.

The above-described exemplary embodiments are intended to be illustrative in all respects, rather than restrictive, of the present invention. Indeed, various other embodiments and modifications to the present disclosure, in addition to those described herein, will be apparent to those of ordinary skill in the art from the foregoing description and accompanying drawings.

For example, it will be appreciated that the optical circuits of the type described hereinabove may be fabricated in different dielectric materials or in semiconductor materials other than silicon, including but not limited to compound semiconductor materials of groups commonly referred to as A3B5 and A2B4, such as GaAs, InP, and their alloys and compounds. Furthermore, example embodiments described hereinabove may have been described primarily with reference to a cross-shaped optical coupler circuit of FIGS. 3, 4, 9 and 10, wherein the four optical couplers are disposed along four legs of a rectangular cross with their ends facing a common area therebetween including the center of the cross, and optical ports at those ends connected to closest optical ports of adjacent couplers to form a ring-like structure. Here, 'adjacent' refers to two couplers that are disposed next to each other when viewed along a circumference of a coupler interconnect area. In such a layout, first two opposing couplers that are aligned along the same leg of the cross function as optical splitters, and the other two opposing couplers that are aligned along the other leg of the cross function as optical combiners, with the input ports of the combiners connected to closest output ports of the two splitters. It will be appreciated however that this layout may be modified, and any four-coupler circuit that is topologically equivalent to the coupler circuits of FIGS. 3, 4 and 5 would be within the bounds of the present disclosure. Here, the term 'topologically equivalent' refers to any modification of the layout of FIG. 3 that may be obtained by moving and/or rotating the optical couplers in the plane of the substrate and stretching the connecting waveguides without breaking the coupler—waveguide connections and without creating waveguide crossings. For example, an embodiment wherein all four of the couplers are substantially parallel to each other with their interconnected ends facing in the same direction would also be within the scope of the present disclosure. Preferably, for each of the two splitters, the two waveguides connecting the two output ports of the splitter to input ports of adjacent combiners should be of the same optical length. It will be also appreciated that various features or elements that are described hereinabove with reference to particular embodiments can also be used in other described embodiments or their variations.

Furthermore in the description above, for purposes of explanation and not limitation, specific details are set forth such as particular architectures, interfaces, techniques, etc. in order to provide a thorough understanding of the present invention. In some instances, detailed descriptions of well-known devices, circuits, and methods are omitted so as not to obscure the description of the present invention with unnecessary detail. Thus, for example, it will be appreciated by those skilled in the art that block diagrams herein can represent conceptual views of illustrative circuitry embodying the principles of the technology. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, while the present invention has been particularly shown and described with reference to example embodiments as illustrated in the drawing, it will be understood by one skilled in the art that various changes in detail may be affected therein without departing from the spirit and scope of the invention as defined by the claims.

We claim:

1. An optical circuit comprising:
   two optical splitters, each comprising an input port and two output ports;
   two optical combiners, each comprising two input ports and at least one output port; and,
   four optical waveguides separately connecting the output ports of the two optical splitters to the input ports of the two optical combiners in a non-intersecting manner,
   wherein the two optical combiners and one of the two optical splitters comprise each a 90° optical coupler, and the other of the two optical splitters is a phase-symmetric optical splitter.

2. The optical circuit of claim 1, wherein each of the two optical combiners comprises two output ports.

3. The optical circuit of claim 2, wherein the output ports of the two optical splitters and the input ports of the two optical combiners are disposed so that each of the two input ports of the two optical combiners is positioned next to one of the two output ports of one of the two optical splitters, and is connected thereto by one of the four optical waveguides.

4. The optical circuit of claim 3, wherein the two output ports of each of the two optical splitters are positioned equidistantly from closest input ports of the two optical combiners.

5. The optical circuit of claim 3, wherein the four optical waveguides separately connect each of the output ports of the two optical splitters to a closest of the input ports of the two optical combiners in the absence of optical phase shifters.

6. The optical circuit of claim 5, wherein the four optical waveguides comprise:
   first and second optical waveguides of equal length, each connecting one of the two output ports of one of the two optical splitters to a closest input port of the two optical combiners, and
   third and fourth optical waveguides of equal length, each connecting one of the two output ports of the other of the two optical splitters to a closest input port of the two optical combiners.

7. The optical circuit of claim 6, wherein the two optical splitters and the two optical combiners are disposed at four corners of a kite-shaped area, with the two output ports of one of the two optical combiners facing the two output ports of one of the two optical combiners across a diagonal thereof.

8. The optical circuit of claim 5, wherein each of the four optical waveguides are of the same length.

9. The optical circuit of claim 8, wherein the two optical splitters and the two optical combiners are disposed at four corners of a square, with the input ports of one of the two optical combiners facing the two output ports of the other of the two optical combiners across a diagonal of the square.

10. The optical circuit of claim 3, forming a 90° optical hybrid.

11. The optical circuit of claim 3, wherein one of the two optical splitters and the two optical combiners comprise each a 2×2 optical coupler.

12. The optical circuit of claim 3, wherein at least one of the two optical splitters and the two optical combiners comprises a directional coupler.

13. The optical circuit of claim 3, wherein at least one of the two optical splitters and the two optical combiners comprises a 90° MMI coupler.

14. The optical circuit of claim 11, wherein the other one of the two optical splitters comprises a Y-branching waveguide splitter.

15. The optical circuit of claim 3, wherein the two optical splitters and the two optical combiners are aligned along two legs of a cross.

16. The optical circuit of claim 8, wherein each of the four optical waveguides is in the form of a 90° waveguide bend.

17. The optical circuit of claim 1, wherein the four optical waveguides comprise a silicon core and a dielectric cladding, and wherein each of the four optical waveguides has a bend radius in the range of 2 microns to 10 microns.

18. An optical coherent receiver comprising the optical circuit of claim 10.

19. An optical coherent receiver comprising two optical circuits of claim 10 connected to outputs of a polarization beam splitter.

20. The optical circuit of claim 1, wherein the two optical combiners and the two optical splitters are disposed along a closed contour with the output ports of the two optical splitters and the input ports of the two optical combiners facing an interior of said contour, and wherein each of the two optical splitters disposed between the two optical combiners as seen along said contour.

* * * * *